United States Patent [19]
Takeuchi et al.

[11] Patent Number: 5,475,279
[45] Date of Patent: Dec. 12, 1995

[54] PIEZOELECTRIC/ELECTROSTRICTIVE ACTUATOR HAVING INTEGRAL CERAMIC BASE MEMBER AND FILM-TYPE PIEZOELECTRIC/ELECTROSTRICTIVE ELEMENT (S)

[75] Inventors: Yukihisa Takeuchi, Aichi; Hideo Masumori, Anjo; Nobuo Takahashi, Owariasahi, all of Japan

[73] Assignees: NGK Insulators, Ltd.; Seiko Epson Corporation, both of Japan

[21] Appl. No.: 408,814

[22] Filed: Mar. 23, 1995

Related U.S. Application Data

[63] Continuation of Ser. No. 66,195, May 25, 1993, abandoned.

[30] Foreign Application Priority Data

May 27, 1992 [JP] Japan ..................... 4-160204
Mar. 22, 1993 [JP] Japan ..................... 5-087997

[51] Int. Cl.⁶ .................................................. H01L 41/08
[52] U.S. Cl. .................................... 310/331; 310/328
[58] Field of Search ........................... 310/328, 330–332; 347/68–72

[56] References Cited

U.S. PATENT DOCUMENTS

| | | | |
|---|---|---|---|
| 3,747,120 | 7/1973 | Stemme | 346/75 |
| 3,946,398 | 3/1976 | Kyser et al. | 346/1 |
| 4,680,595 | 7/1987 | Cruz-Uribe et al. | 346/140 R |
| 4,695,854 | 9/1987 | Cruz-Uribe | 346/140 |
| 4,937,597 | 6/1990 | Yasuhara | 346/140 R |
| 5,089,455 | 2/1992 | Ketcham et al. | 501/104 |
| 5,144,342 | 9/1992 | Kubota | 346/140 R |

FOREIGN PATENT DOCUMENTS

| | | |
|---|---|---|
| 0188632 | 7/1986 | European Pat. Off. . |
| 0408305 | 1/1991 | European Pat. Off. ............ 310/358 |
| 0408306 | 1/1991 | European Pat. Off. ............ 310/358 |
| 0443628A2 | 8/1991 | European Pat. Off. . |
| 0455342 | 11/1991 | European Pat. Off. ............ 310/358 |
| 0468796 | 1/1992 | European Pat. Off. ........ H01L 41/04 |
| 62-213399 | 9/1987 | Japan . |
| 3-128681 | 5/1991 | Japan . |

OTHER PUBLICATIONS

Patent Abstracts of Japan, vol. 8, No. 201 (M–325) Sep. 14, 1984 & JP–A–49 089 163 (EPSON KK) May 23, 1987.

*Primary Examiner*—Mark O. Budd
*Attorney, Agent, or Firm*—Parkhurst, Wendel & Rossi

[57] ABSTRACT

A piezoelectric/electrostrictive actuator including a ceramic base member having a pressure chamber or chambers, and a piezoelectric/electrostrictive element or elements is disclosed. The base member includes a spacer plate having at least one window which provides the pressure chamber(s), and which is closed by a closure plate and a connecting plate disposed on the opposite surfaces of the spacer plate. The spacer plate, closure plate and connecting plate are formed from respective ceramic green sheets which are laminated on each other and fired into an integral ceramic structure as the ceramic base member. Each piezoelectric/electrostrictive element is disposed on a wall partially defining the corresponding pressure chamber, for deforming the wall so as to change a pressure of the corresponding chamber. The element has a piezoelectric/electrostrictive unit consisting of a pair of electrodes and a piezoelectric/electrostrictive layer, which are formed by a film-forming method on an outer surface of the closure plate of the base member.

12 Claims, 5 Drawing Sheets

PIEZOELECTRIC/ELECTROSTRICTIVE ACTUATOR HAVING INTEGRAL CERAMIC BASE MEMBER AND FILM-TYPE PIEZOELECTRIC/ELECTROSTRICTIVE ELEMENT (S)

This is a Continuation of application Ser. No. 08/066,195 filed May 25, 1993, now abandoned.

BACKGROUND OF THE INVENTION

1. Field of the Invention

The present invention relates in general to a piezoelectric/electrostrictive actuator, and more particularly to such a piezoelectric/electrostrictive actuator which has a novel structure that assures improved and stable operating characteristics, and which can be produced with significantly improved efficiency.

2. Discussion of Related Art

In recent years, there has been known an actuator having a base member defining a pressure chamber, and a piezoelectric/electrostrictive element disposed on a wall of the pressure chamber, for raising the pressure of a fluid in the chamber so as to change the volume of the chamber. Such a piezoelectric/electrostrictive actuator may be used as an ink pump for a print head used in an ink jet printer, for example. To effect printing by the print head, an ink material is supplied to the pressure chamber to fill the same, and the pressure within the chamber is raised by displacement of the piezoelectric/electrostrictive element, so that ink particles are jetted through a nozzle which communicates with the pressure chamber.

Referring to FIGS. 5 and 6, there is illustrated an example of ink jet print head which uses as an ink pump the above-described piezoelectric/electrostrictive actuator. This print head has an ink nozzle member 16 which consists of a metallic nozzle plate 4 having a plurality of nozzles 2, a metallic orifice plate 8 having a plurality of orifices 6, and a channel plate 10, which are superposed on each other such that the channel plate 10 is interposed between the plates 4, 8. These plates 4, 8, 10 are bonded together into the ink nozzle member 16, so as to form a plurality of ink discharge channels 12 for leading or guiding an ink material to the respective nozzles 2, and at least one ink supply channel 14 for leading or supplying the ink material to the orifices 6. A piezoelectric/electrostrictive actuator 25 used as an ink pump for the print head includes a base member 24 consisting of two plates 18, 20 made of metal or synthetic resin and formed in lamination on the ink nozzle member 16. The base member 24 is formed with a plurality of voids 22 which correspond to the nozzles 2 and orifices 6. A plurality of piezoelectric/electrostrictive elements 28 corresponding to the respective voids 22 are secured to an outer surface of the plate 18 of the base member 24 of the actuator 25. With this actuator 25 superposed on and bonded to the ink nozzle member 16, each of the voids 22 provides an ink chamber 26 in which the pressure of the ink is raised by displacement of the corresponding piezoelectric/electrostrictive element 28.

In producing the actuator 25 used in the above print head, however, small pieces of the piezoelectric/electrostrictive elements 28 must be bonded to the walls of the respective ink chambers 26, which makes it extremely difficult to render the resulting print head sufficiently small-sized. Further, the bonding of the piezoelectric/electrostrictive elements 28 inevitably pushes up the cost of manufacture of the print head, and makes it difficult for the elements 28 to maintain sufficiently high reliability.

Further, it is extremely difficult to bond the actuator 25 to the ink nozzle member 16, since the spacing between the adjacent voids 22, 22 formed in the print head, that is, the thickness "t" of a partition wall 30 which separates the adjacent voids from each other, is considerably small, more precisely, about 1 mm or smaller.

More specifically, an adhesive used for bonding the ink nozzle member 16 and the actuator 25 is likely to overflow onto the opposite surfaces of the partition wall 30. Therefore, the ink chambers 26 and/or ink flow channels including the ink supply and discharge channels 12, 14 and orifices 6 may be deformed, whereby the ink-jetting characteristics of the print head may deteriorate, resulting in reduced quality and yield of the products (print heads).

If the amount of the adhesive applied is reduced to avoid its overflow as described above, it is likely that the ink nozzle member 16 and actuator 25 are insufficiently or poorly bonded together at some portions of the interface of the members 16, 24. This may result in incomplete sealing between the adjacent ink chambers 26, 26, causing leakage of the pressures of the ink chambers 26, 26 and consequent crosstalk, for example. The partial or insufficient bonding may also leave gaps between the bonding surfaces of the members 16, 24, resulting in pressure loss upon pressurizing of the ink chambers 26 due to the air remaining in the gaps. Consequently, the ink-jetting characteristics of the print head may be lowered.

SUMMARY OF THE INVENTION

It is therefore an object of the present invention to provide a piezoelectric/electrostrictive actuator which can be easily bonded to another member (such as an ink nozzle member of an ink jet print head), to alleviate or eliminate the above problems due to incomplete bonding or overflow of an adhesive from bonding surfaces thereof, thereby assuring excellent operating characteristics with high stability. It is also an object of the invention to provide such a piezoelectric/electrostrictive actuator which can be easily produced with improved efficiency, and which is sufficiently small-sized.

The above object may be accomplished according to the principle of the present invention, which provides a piezoelectric/electrostrictive actuator comprising: a ceramic base member in which at least one pressure chamber is formed, the ceramic base member consisting of a spacer plate having at least one window which provides the pressure chamber or chambers, a closure plate disposed on one of opposite major surfaces of the spacer plate, for closing one opening of each window, and a connecting plate disposed on the other major surface of the spacer plate, for closing the other opening of each window, the connecting plate having at least one hole formed in alignment with the window(s), the spacer plate, the closure plate and the connecting plate being formed from respective ceramic green sheets which are laminated on each other and fired into an integral ceramic structure as the ceramic base member; and at least one piezoelectric/electrostrictive element each disposed on a wall partially defining the corresponding pressure chamber, for deforming the wall so as to change a pressure of the corresponding pressure chamber, each piezoelectric/electrostrictive element comprising a piezoelectric/electrostrictive unit consisting of a pair of electrodes and a piezoelectric/electrostrictive layer, which are formed by a film-forming method on an outer surface of the closure plate of the ceramic base member, such that the piezoelectric/electrostrictive layer is interposed between the pair of electrodes.

The above piezoelectric/electrostrictive actuator constructed according to the present invention can be produced with significantly improved efficiency, assuring improved product quality, since two or more piezoelectric/electrostrictive elements can be easily formed at a time by a film-forming method with high efficiency. This also makes the resultant actuator sufficiently small-sized. Since the ceramic base member has a three-layer structure consisting of the closure plate, the spacer plate and the connecting plate, the present actuator exhibits a sufficiently high degree of rigidity even before firing, i.e., even when it is a laminar structure of green sheets for these plates, thereby assuring improved handling ease of the laminar structure and enhanced production efficiency of the actuator.

Further, the piezoelectric/electrostrictive actuator as described above may be suitably used as an ink pump for an ink jet print head, for example. In this case, the actuator having the above three-layer structure of the ceramic base member can be bonded to a member, such as an ink nozzle member of the print head, assuring a remarkably improved seal at bonding surfaces of the actuator and ink nozzle member so as to establish fluid-tightness of an ink flow channel through which the ink flows through the print head. The thus obtained ink jet print head has an improved and stable product quality.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
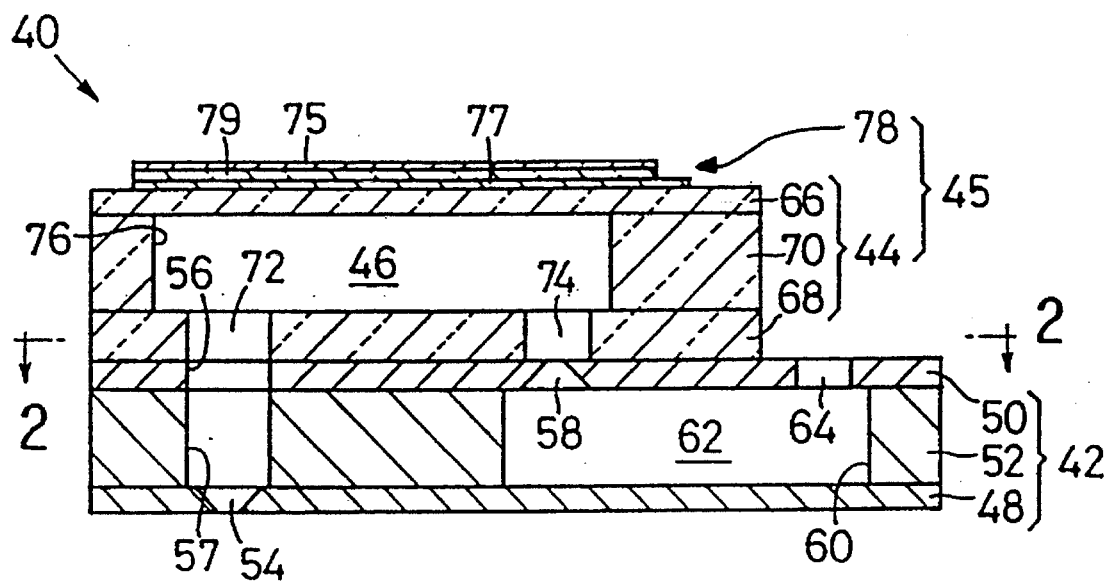
FIG. 1 is a vertical cross sectional view showing an ink jet print head which includes one embodiment of a piezoelectric/electrostrictive actuator of the present invention.
Figure 2:
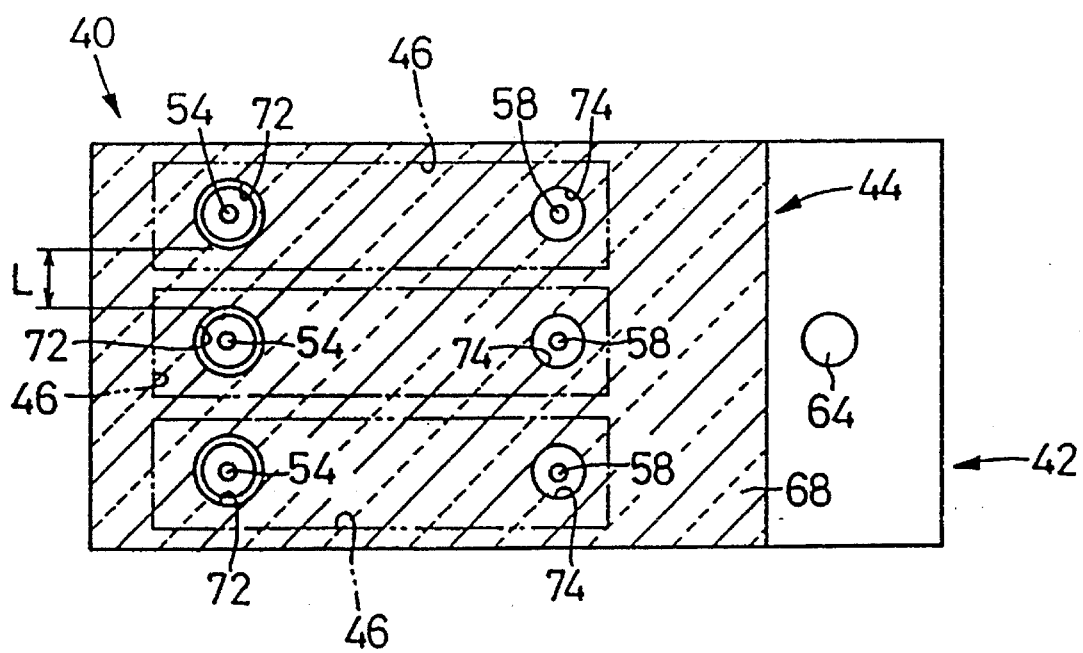
FIG. 2 is a cross sectional view taken along line 2—2 of FIG. 1.
Figure 3:
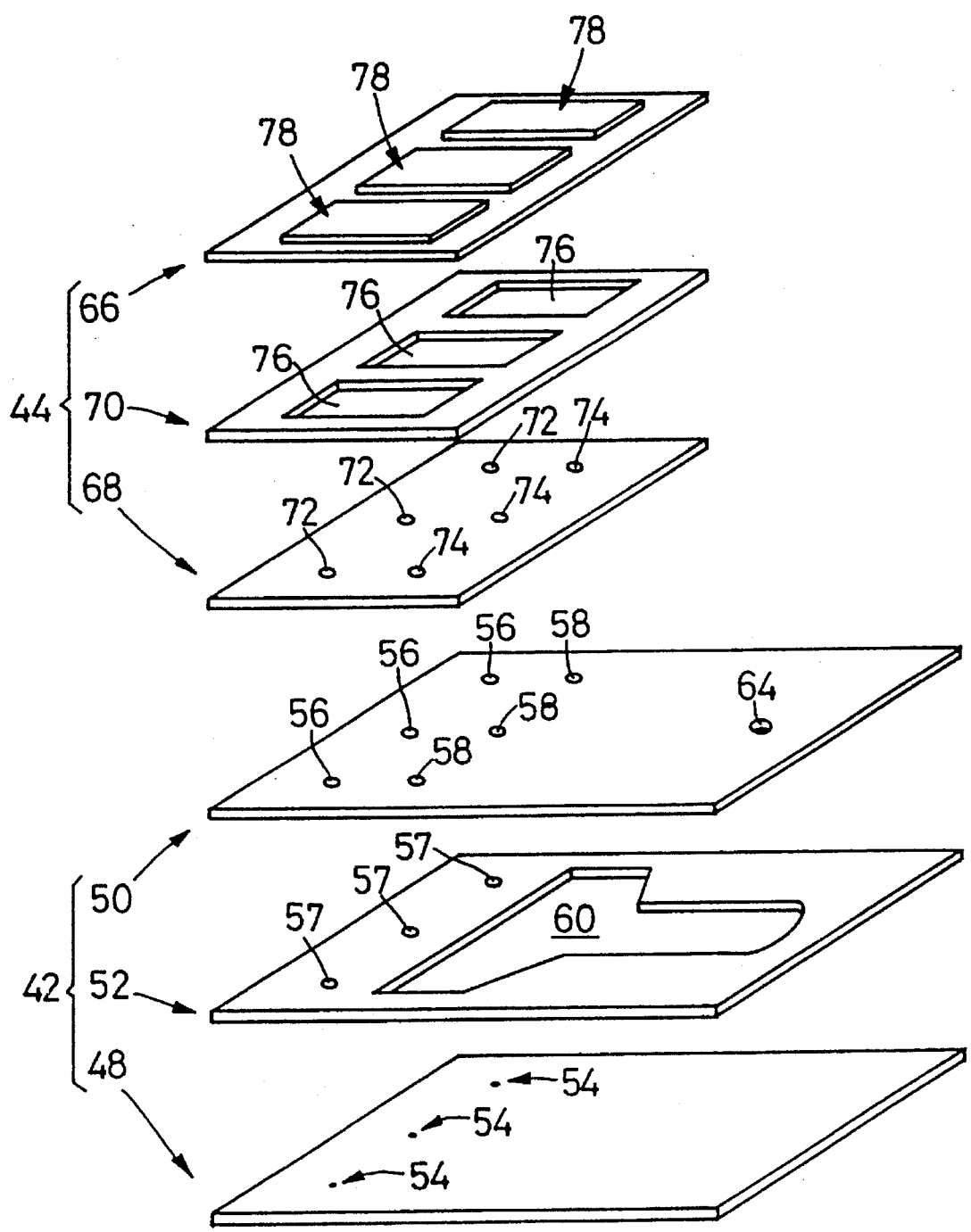
FIG. 3 is an exploded perspective view explaining the construction of the ink jet print head of FIG. 1.

Referring to FIGS. 1 and 2 schematically showing an ink jet print head 40, and to FIG. 3 which is an exploded perspective view of the print head 40, an ink nozzle member 42 and a piezoelectric/electrostrictive actuator 45 as one embodiment of the present invention are bonded together to form an integral structure of the ink jet print head 40. In this print head 40, an ink material is supplied to a plurality of pressure chambers 46 formed in the actuator 45, and is jetted or discharged from a plurality of nozzles 54 formed through the ink nozzle member 42.

More specifically, the ink nozzle member 42 consists of a nozzle plate 48 and an orifice plate 50 having a relatively small thickness, and a channel plate 52 interposed between these plates 48, 50. The nozzle plate 48 and the orifice plate 50 are integrally bonded to the channel plate 52 by means of an adhesive.

The nozzle plate 48 has a plurality of nozzles 54 (three in this embodiment) formed therethrough, for permitting jets of fine ink particles, while the orifice plate 50 and the channel plate 52 have respective through-holes 56, 57 formed through the thicknesses thereof. These through-holes 56, 57 are aligned with the respective nozzles 54 as viewed in the direction of the thickness of the plates 48, 50, 52, and have a diameter which is larger by a given value than that of the nozzles 54.

The orifice plate 50 further has a plurality of orifices 58 (three in this embodiment) formed therethrough, for permitting flow of the ink into the respective pressure chambers 46. The channel plate 52 is formed with a window 60 which is closed at its opposite openings by the nozzle plate 48 and orifice plate 50, respectively, whereby an ink supply channel 62 communicating with the orifices 58 is defined by the channel plate 52, the nozzle plate 48 and the orifice plate 50. The orifice plate 50 further has a supply port 64 through which the ink is fed from an ink reservoir into the ink supply channel 62.

While the material used for the plates 48, 50, 52 of the ink nozzle member 42 is not particularly limited, these plates 48, 50, 52 are preferably made of a plastic, or a metal such as nickel or stainless steel, which enables the nozzles 54 and orifices 58 to be formed in the respective plates 48, 50 with high accuracy. Each of the orifices 58 is desirably formed in tapered shape such that the diameter of the orifice 58 is reduced in the direction of flow of the ink (i.e., the direction from the ink supply channel 62 toward the pressure chambers 46), as shown in FIG. 1 by way of example, so as to function as a check valve for inhibiting the ink from flowing in the reverse direction.

The piezoelectric/electrostrictive actuator 45 consists of a ceramic base member 44 and a plurality of piezoelectric/electrostrictive elements 78 formed integrally on the base member 44. The ceramic base member 44 consists of a closure plate 66 and a connecting plate 68 having a relatively small thickness, and a spacer plate 70 interposed between these plates 66, 68. These plates 66, 68, 70 are superposed on each other and formed integrally into the ceramic base member 44 in a manner as described later.

The connecting plate 68 has first communication holes 72 and second communication holes 74 formed therethrough, which are respectively aligned with the through-holes 56 and orifices 58 formed in the orifice plate 50, as viewed in the direction of thickness of the plates 68, 50. The diameter of the first communication holes 72 is substantially equal to or slightly larger than that of the through-holes 56, while the diameter of the second communication holes 74 is larger by a given value than that of the orifices 58.

The spacer plate 70 has a plurality of rectangular windows 76 formed therethrough. The spacer plate 70 is superposed on the connecting plate 68 such that each of the windows 76 communicates with the corresponding first and second communication holes 72, 74 formed in the connecting plate 68.

The above-indicated closure plate 66 is superposed on one of the opposite major surfaces of the spacer plate 70 remote from the connecting plate 68, so as to close openings of the windows 76. In this arrangement, the pressure chambers 46 are formed within the ceramic base member 44, such that the chambers 46 communicate with an exterior space through the first and second communication holes 72, 74.

The ceramic base member 44 is formed as an integrally formed fired ceramic structure. That is, in the process of producing the base member 44, green sheets are initially formed by using a slurry that is prepared from ceramic materials, binders, liquid solvents and others, by means of a generally used device such as a doctor blade device or a reverse roll coater. Then, the green sheets are subjected to suitable processing such as cutting, machining or punching, as needed, so as to form the windows 76 and the first and second communication holes 72, 74. Thus, there are formed precursors for the plates 66, 68, 70. These precursors are then laminated on each other and fired into an integral ceramic body as the ceramic base member 44.

While the ceramic material used for forming the ceramic base member 44 is not particularly limited, alumina, zirconia or the like may be favorably employed in view of its formability and other properties. The closure plate 66 preferably has a thickness of 50 μm or smaller, more preferably, within a range of about 3 to 12 μm. The connecting plate 68 preferably has a thickness of 10 μm or larger, more preferably, 50 μm or larger. The spacer plate 70 preferably has a thickness of 50 μm or larger, more preferably, 100 μm or larger.

The above-described ceramic base member 44, which is formed as an integral fired ceramic structure, does not require any particular adhesive treatment for bonding the plates 66, 68, 70 together. Accordingly, complete and secure sealing can be achieved at the interfaces between the closure plate 66 and spacer plate 70 and between the connecting plate 68 and spacer plate 70.

In addition, the ceramic base member 44 can be produced with improved efficiency, due to the presence of the connecting plate 68. Namely, it is generally difficult to handle a laminar structure consisting of thin, flexible green sheets, and fracture of the laminar structure and abnormal deformation of a resultant fired body tend to occur due to strains induced in the laminar structure when it is inadvertently supported upon its setting on a furnace. In the instant embodiment, however, the laminar structure including the connecting plate 68 exhibits an enhanced rigidity due to the presence of the plate 68, assuring improved handling ease thereof, while reducing the possibility of occurrence of defect due to handling failure, as compared with when the structure does not include the connecting plate 68. Further, it is normally impossible to handle a laminar structure consisting only of the closure plate 66 and spacer plate 70 where the pressure chambers 46 are formed with high density in the ceramic base member 44, that is, where the ceramic base member 44 includes a comparatively large number of pressure chambers 46. In the instant embodiment, however, the connecting plate 68 makes it possible to handle the laminar structure even in the above-described situation.

While the configuration of the ceramic base member 44 varies depending upon various factors relating to production of this member 44, it is desirable that the surface of the ceramic base member 44 which is to be bonded to the ink nozzle member 42, that is, the outer surface of the connecting plate 68, is made even or smooth. The evenness of the relevant surface of the ceramic base member 44 is suitably controlled so that the surface has the maximum waviness of not larger than 50 μm as measured along a reference length of 8 mm, by means of "roughness measuring system".

Desirably, the maximum waviness of the relevant surface is not larger than 25 μm, more desirably, not larger than 10 μm. As a means for achieving the above degree of surface evenness, the fired ceramic body which gives the base member 44 may be subjected to machining such as lapping or surface grinding.

On the ceramic base member 44, more precisely, on the outer surface of the closure plate 66, there are formed piezoelectric/electrostrictive elements 78 which correspond to the respective pressure chambers 46 formed in the member 44. Each of the piezoelectric/electrostrictive elements 78 has a Piezoelectric/electrostrictive unit consisting of a lower electrode 77, a piezoelectric/electrostrictive layer 79, and an upper electrode 75, which are formed in lamination on the closure plate 66, by a suitable film-forming method. As the piezoelectric/electrostrictive element 78 of the instant embodiment, it is particularly preferable to employ a piezoelectric/electrostrictive element as proposed in co-pending U.S. patent application Ser. No. 07/912,920 assigned to the same assignee as the present patent application.

More specifically, the closure plate 66, which serves as a substrate for the piezoelectric/electrostrictive elements 78, is suitably formed by a ceramic substrate made of a material whose major component is zirconia having a crystal phase that is partially or fully stabilized by a suitable compound or compounds. The term "partially or fully stabilized zirconia" used herein should be interpreted to mean zirconia whose crystal phase is partially or fully stabilized, so that the crystal phase partially undergoes or does not undergo phase transformations, respectively, upon application of heat, stress or the like thereto.

The above-indicated compound or compounds for stabilizing the zirconia is selected from the group consisting of: yttrium oxide; cerium oxide; magnesium oxide; and calcium oxide. The zirconia is partially or fully stabilized as desired, by addition of at least one of these compounds, that is, a selected one of the above-indicated oxides or a selected combination of two or more of these oxides. It is desirable to stabilize the zirconia by adding 2 to 7 mole % of yttrium oxide, or 6 to 15 mole % of cerium oxide, or 5 to 12 mole % of magnesium oxide or calcium oxide. It is particularly recommended to use yttrium oxide in an amount of 2 to 7 mole %, more preferably, 2 to 4 mole %, so as to partially stabilize the zirconia. With the addition of the yttrium oxide in the above range, the zirconia has a primary crystal phase which is partially stabilized as a tetragonal phase or a combination of a cubic phase and the tetragonal phase, to provide the ceramic substrate (closure plate 66) having excellent properties. Further, the average crystal grain size of the ceramic substrate is preferably controlled to within a range of 0.05 μm–2 μm, more preferably, to 1 m or smaller, so as to ensure the presence of the tetragonal phase and assure a sufficiently large mechanical strength of the ceramic substrate.

On the outer surface of the closure plate 66 are formed suitable films of the upper and lower electrodes 75, 77 and the piezoelectric/electrostrictive layers 79, by any one of various known methods which include thick-film forming process such as screen printing, spraying, dipping and coating, and thin-film forming process such as ion-beam method, sputtering, vacuum vapor deposition, ion plating, CVD and plating. These layers 75, 77, 79 may be formed either before or after firing of the closure plate 66 (the ceramic base member 44). Then, the electrode films 75, 77 and piezoelectric/electrostrictive layer 79 thus formed on the closure plate 66 may be heat-treated as needed, either in different steps following formation of the respective layers 75, 77, 79, or in one step following formation of all of the layer 75, 77, 79. To assure improved reliability of insulation between the electrode films 75, 77, there may be formed as needed an insulating resin layer between the adjacent piezoelectric/electrostrictive layers 79, 79.

The electrode films 75, 77 of each piezoelectric/electrostrictive unit may be formed of any electrically conductive material which can withstand a high-temperature oxidizing atmosphere generated upon the heat-treatment or firing as described above. For instance, the electrode films 75, 77 may be formed of a single metal, an alloy of metals, a mixture of a metal or alloy and an electrically insulating ceramic or glass, or an electrically conductive ceramic. Preferably, the electrode material has as a major component a noble metal having a high melting point, such as platinum, palladium or rhodium, or an alloy such as silver-palladium alloy, silver-platinum alloy or platinum-palladium alloy.

The piezoelectric/electrostrictive layer 79 of each Piezoelectric/electrostrictive unit may be formed of any piezoelectric or electrostrictive material which produces a relatively large amount of strain or displacement due to the converse or reverse piezoelectric effect or the electrostrictive effect. The piezoelectric/electrostrictive material may be either a crystalline material or an amorphous material, and may be a semi-conductor material or a dielectric or ferroelectric ceramic material. Further, the piezoelectric/electrostrictive material may either require a treatment for initial polarization or poling, or may not require such a polarization treatment.

The piezoelectric/electrostrictive material used for the piezoelectric/electrostrictive layer 79 preferably contains as a major component lead zirconate titanate (PZT), lead magnesium niobate (PMN), lead nickel niobate (PNN), lead manganese niobate, lead antimony stannate, lead zinc niobate, lead titanate, or a mixture thereof. The piezoelectric/ electrostrictive material having the above-indicated major component may further contain as an additive an oxide or other compound of lanthanum, barium, niobium, zinc, cerium, cadnium, chromium, cobalt, strontium, antimony, iron, yttrium, tantalum, tungsten, nickel, and/or manganese, so as to provide a material containing PLZT, for example.

The piezoelectric/electrostrictive unit consisting of the electrode films 75, 77 and the piezoelectric/electrostrictive layer 79 generally has a thickness of not larger than 100 μm. The thickness of each of the electrode films 75, 77 is generally 20 μm or smaller, preferably 5 μm or smaller. To assure a relatively large amount of displacement by application of a relatively low voltage, the thickness of the piezoelectric/electrostrictive layer 79 is preferably 50 μm or smaller, more preferably, within a range of 3 μm to 40 μm.

Since the substrate of the piezoelectric/electrostrictive element 78 is constituted by the closure plate 66 formed of a material having partially stabilized zirconia as a major component, the element 78 exhibits sufficiently high degrees of mechanical strength and toughness even though the plate 66 has a relatively small thickness. At the same time, the thus formed piezoelectric/electrostrictive element 78 can provide a relatively large amount of displacement by application of a relatively low operating voltage, with a relatively large magnitude of force or electric potential generated, and has an improved operating response.

In addition, the film-forming method used for forming the electrode films 75, 77 and the piezoelectric/electrostrictive layer 79 permits a relatively large number of the piezoelectric/electrostrictive elements 78 to be formed on the closure plate 66 of the ceramic base member 44. That is, in the film-forming process as described above, the elements 78 can be concurrently and easily formed with a minute spacing left between the adjacent ones, without using an adhesive or the like. Accordingly, a plurality of piezoelectric/electrostrictive elements 78 can be easily formed on appropriate portions of the ceramic base member 44 which correspond to the respective pressure chambers 46 formed therein.

After firing the ceramic base member 44 formed integrally with the piezoelectric/electrostrictive elements 78, the thus obtained piezoelectric/electrostrictive actuator 45 is superposed on the above-described ink nozzle member 42, and these actuator and nozzle member 45, 42 are bonded together by a suitable adhesive, such as epoxy resin, into an integral structure of the ink jet print head 40, as shown in FIG. 1. In this ink jet print head 40, the ink material which is led through the ink supply channel 62 is supplied to the pressure chambers 46 through the respective orifices 58, and is passed through the through-holes 56, 57 and jetted outwards from the nozzles 54, based on the operation of the piezoelectric/electrostrictive elements 78 of the actuator 45.

Upon bonding of the actuator 45 and the ink nozzle member 42 as described above, the pressure chambers 46 formed in the actuator 45 are suitably held in communication with the nozzles 54 and the ink supply channel 62 formed in the ink nozzle member 42, with the first and second communication holes 72, 74 being in communication with the through-holes 56 and orifices 58 formed through the orifice plate 50 of the ink nozzle member 42, respectively.

To achieve sufficient fluid-tightness of the ink flow channel through which the ink flows in the print head 40, the seal between the bonding surfaces of the actuator 45 and the ink nozzle member 42 needs to be well established only at around the first and second communication holes 72, 74. This leads to a significantly reduced area of bonded portions which must provide a complete seal, permitting the ink flow channel to easily and surely assure excellent fluid-tightness. Since the present ink jet print head 40 does not suffer from overflow of the adhesive into the pressure chambers 46, and otherwise possible gaps formed between the bonding surfaces of the actuator 45 and ink nozzle member 42, the print head 40 exhibits significantly improved ink-jetting characteristics with high stability.

In this particular embodiment, the diameters of the first and second communication holes 72, 74 are set to be smaller than the width dimension of the pressure chamber 46 (the width dimension of the window 76 formed in the spacer plate 70). Therefore, the adjacent ones of the first communication holes 72 and those of the second communication holes 74 are spaced apart from each other by a sufficiently large distance (indicated by "L" in FIG. 2).

The above arrangement assures a sufficiently large area of bonding between the actuator 45 and the ink nozzle member 42, at around the respective first and second communication holes 72, 74. Accordingly, a further improved seal can be obtained at the bonding surfaces even if the actuator 45 and the ink nozzle member 42 are made of different kinds of materials.

Figure 7:
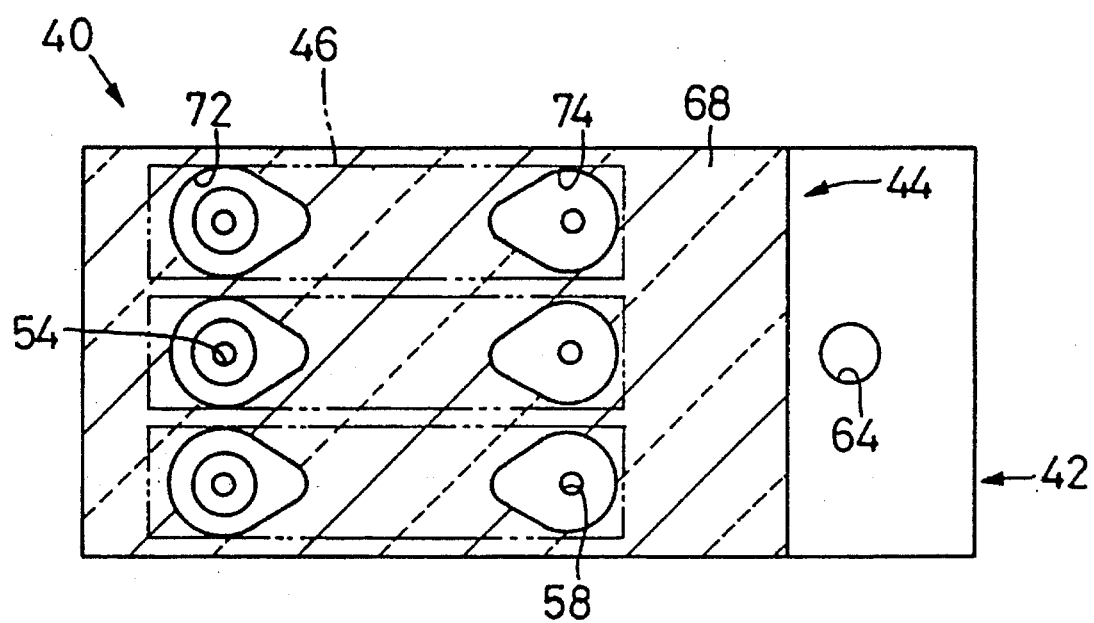
FIG. 7 is a cross sectional view corresponding to that of FIG. 2, showing a modification of first and second communication holes of the ink jet print head of FIG. 1.

Depending upon the kind of the adhesive used or the method of application of the adhesive, there is a possibility that the adhesive would overflow into the first and second communication holes 72, 74 to thereby close the openings of these holes 72, 74. In this case, it is desirable that the diameter of the first and second communication holes 72, 74 be set to be substantially equal to the width dimension of the corresponding pressure chamber 46, so as to avoid the closure of the openings of the holes 72, 74. It is also desirable to form one or both of the first and second communication holes 72, 74 in teardrop shape as shown in FIG. 7, or elliptic shape.

Figure 5:
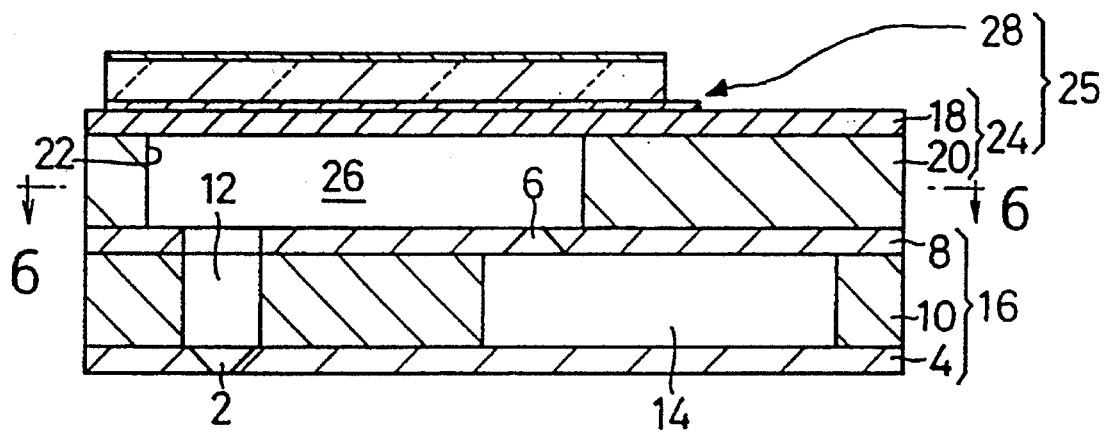
FIG. 5 is a vertical cross sectional view showing one example of a conventional ink jet print head.
Figure 6:
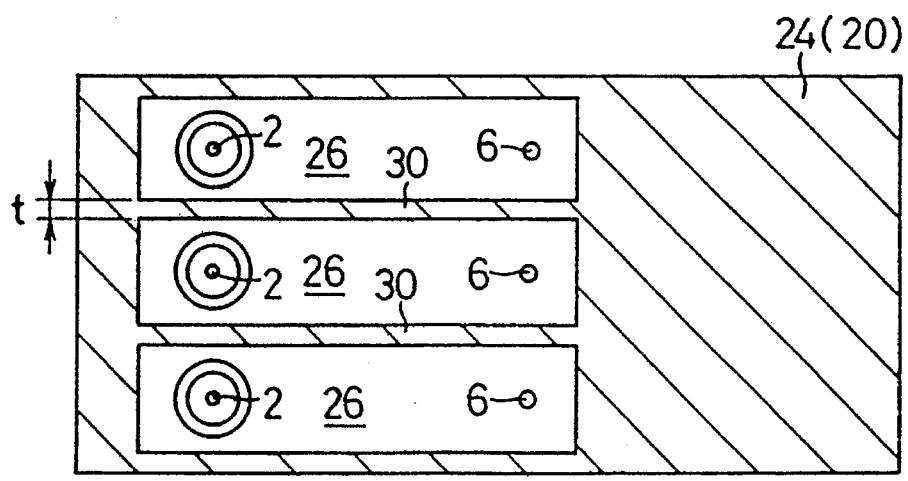
FIG. 6 is a cross sectional view taken along line 6—6 of FIG. 5.

It will be easily understood by comparing the shapes of the bonding surfaces of the ink nozzle member 42 and the actuator 45 of the ink jet print head 40 of the instant embodiment, with those of the ink nozzle member 16 and the actuator 25 of the conventional ink jet print head as shown in FIGS. 5 and 6 that the print head 40 of the instant embodiment can achieve a significantly improved seal at the bonding surfaces of the members 42, 45, as compared with the conventional counterpart of FIGS. 5 and 6.

While the present invention has been described in its presently preferred embodiment with a certain degree of particularity, it is to be understood that the invention is not limited to the details of the illustrated embodiment, but may be otherwise embodied.

For example, the piezoelectric/electrostrictive actuator constructed according to the present invention may be used as an ink pump for ink jet print heads having various other structures, and may also be used for microphones, piezoelectric loudspeakers, sensors, vibrators or resonators, filters and other components or devices.

Figure 4:
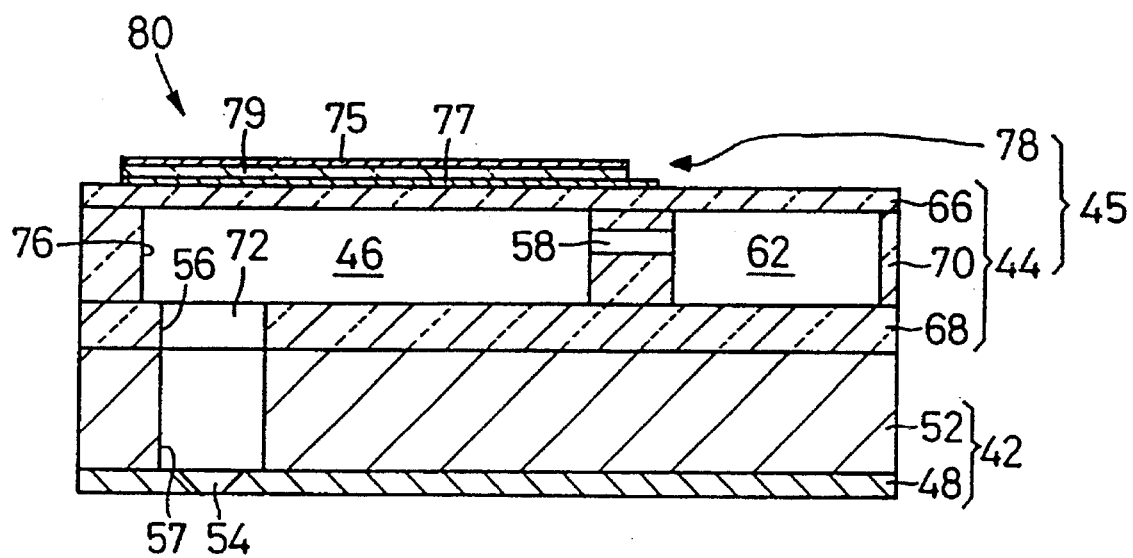
FIG. 4 is a vertical cross sectional view corresponding to that of FIG. 1, showing an ink jet print head which includes another embodiment of a piezoelectric/electrostrictive actuator of the present invention.

The construction of the present piezoelectric/electrostrictive element is by no means limited to that of the illustrated embodiment. While the ink supply channel 62 through which the ink is fed into the pressure chambers 46 is formed within the ink nozzle member 42 in the illustrated embodiment, the supply channel 62 may be formed within the actuator 45, as shown in FIG. 4 by way of example. In this figure, the same numerals as used in FIG. 1 showing the first embodiment are used for identifying structurally or functionally corresponding elements, so as to facilitate understanding of the embodiment of FIG. 4.

It is also to be understood that the present invention may be embodied with various other changes, modifications and improvements, which may occur to those skilled in the art, without departing from the spirit and scope of the invention defined in the following claims.

What is claimed is:

1. A piezoelectric/electrostrictive actuator comprising:

a ceramic base member in which at least one pressure chamber is formed, said ceramic base member consisting of a spacer plate having at least one window which provides said at least one pressure chamber, respectively, a closure plate disposed on one of opposite major surfaces of said spacer plate, for closing one of opposite openings of each of said at least one window, and a connecting plate disposed on the other major surface of said spacer plate, for closing the other opening of said each window, said connecting plate having at least one hole formed in alignment with said at least one window, respectively, said connecting plate having an outer surface remote from said spacer plate, said outer surface having maximum waviness of not larger than 50 μm per reference length of 8 mm, said spacer plate, said closure plate and said connecting plate being formed from respective first, second and third ceramic green sheets which are laminated on each other and fired into an integral ceramic structure as said ceramic base member, the at least one hole of the connecting plate being formed through the thickness of the third ceramic green sheet, and the at least one window being formed through the thickness of the first ceramic green sheet; and at least one piezoelectric/electrostrictive element each disposed on a wall partially defining the corresponding one of said at least one pressure chamber, for deforming said wall so as to change a pressure of the corresponding pressure chamber, each of said at least one piezoelectric/electrostrictive element comprising a piezoelectric/electrostrictive unit consisting of a pair of electrodes and a piezoelectric/electrostrictive layer, which are formed by a thick-film forming method on an outer surface of said closure plate of said ceramic base member, or on an outer surface of the second ceramic green sheet which forms said closure plate, such that said piezoelectric/electrostrictive layer is interposed between said pair of electrodes.

2. A piezoelectric/electrostrictive actuator according to claim 1, wherein said ceramic base member is comprised of alumina or zirconia.

3. A piezoelectric/electrostrictive actuator according to claim 1, wherein said closure plate has a thickness of not larger than 50 μm.

4. A piezoelectric/electrostrictive actuator according to claim 1, wherein said connecting plate has a thickness of not smaller than 10 μm.

5. A piezoelectric/electrostrictive actuator according to claim 1, wherein said spacer plate has a thickness of not smaller than 50 μm.

6. A piezoelectric/electrostrictive actuator according to claim 1, wherein said closure plate is comprised of a ceramic material containing partially or fully stabilized zirconia as a major component.

7. A piezoelectric/electrostrictive actuator according to claim 6, wherein said ceramic material of said closure plate contains as a major component partially stabilized zirconia having a crystal phase that is partially stabilized by addition of yttrium oxide.

8. A piezoelectric/electrostrictive actuator according to claim 1, wherein said closure plate has an average crystal grain size within a range of 0.05 μm–2 μm.

9. A piezoelectric/electrostrictive actuator according to claim 1, wherein said piezoelectric/electrostrictive unit has a thickness of not larger than 100 μm.

10. A piezoelectric/electrostrictive actuator according to claim 1, wherein each of said pair of electrodes has a thickness of not larger than 20 μm.

11. A piezoelectric/electrostrictive actuator according to claim 1, wherein said piezoelectric/electrostrictive layer has a thickness of not larger than 50 μm.

12. A piezoelectric/electrostrictive actuator according to claim 1, which is used as an ink pump of an ink jet print head, and which is superposed on and bonded to an ink nozzle member of the ink jet print head, said ink nozzle member having at least one nozzle through which particles of ink are jetted, said at least one hole of said connecting plate of said ceramic base member being in held in communication with said at least one nozzle of said ink nozzle member, respectively.

\* \* \* \* \*